US009401461B2

(12) United States Patent
Andrews et al.

(10) Patent No.: US 9,401,461 B2
(45) Date of Patent: Jul. 26, 2016

(54) LED CHIP DESIGN FOR WHITE CONVERSION

(75) Inventors: Peter S. Andrews, Durham, NC (US); Joshua J. Markle, Raleigh, NC (US); Ronan P. Le Toquin, Durham, NC (US)

(73) Assignee: CREE, INC., Durham, NC (US)

( * ) Notice: Subject to any disclaimer, the term of this patent is extended or adjusted under 35 U.S.C. 154(b) by 525 days.

(21) Appl. No.: 11/775,958

(22) Filed: Jul. 11, 2007

(65) Prior Publication Data

US 2009/0014731 A1     Jan. 15, 2009

(51) Int. Cl.
*H01L 33/50*    (2010.01)
*H01L 33/00*    (2010.01)

(52) U.S. Cl.
CPC ............ *H01L 33/508* (2013.01); *H01L 33/005* (2013.01); *H01L 33/505* (2013.01); *H01L 2224/48091* (2013.01)

(58) Field of Classification Search
CPC ..... H01L 33/50; H01L 33/502; H01L 33/504; H01L 33/505; H01L 33/507; H01L 33/508
USPC .................................................. 257/79–103
See application file for complete search history.

(56) References Cited

U.S. PATENT DOCUMENTS

| 4,308,114 A | 12/1981 | Das et al. ...................... 205/380 |
| 4,902,535 A | 2/1990 | Garg et al. ..................... 139/292 |
| 4,946,547 A | 8/1990 | Palmour et al. | |
| 5,200,022 A | 4/1993 | Kong et al. | |
| RE34,861 E | 2/1995 | Davis et al. | |
| 5,767,573 A | 6/1998 | Noda et al. ..................... 257/675 |
| 5,813,753 A | 9/1998 | Vriens et al. | |
| 5,959,316 A | 9/1999 | Lowery | |
| 6,188,230 B1 | 2/2001 | Birk .............................. 324/756 |
| 6,323,480 B1 | 11/2001 | Tran et al. .................. 250/214.1 |
| 6,395,564 B1 | 5/2002 | Huang et al. | |
| 6,417,019 B1 * | 7/2002 | Mueller et al. .................. 438/29 |
| 6,483,196 B1 | 11/2002 | Wojnarowski et al. ........ 257/778 |
| 6,577,073 B2 | 6/2003 | Shimizu et al. | |
| 6,598,998 B2 | 7/2003 | West et al. ..................... 362/307 |
| 6,603,146 B1 * | 8/2003 | Hata et al. ........................ 257/79 |
| 6,610,563 B1 | 8/2003 | Waitl et al. ..................... 438/166 |
| 6,635,363 B1 | 10/2003 | Duclos et al. ................. 428/690 |
| 6,734,465 B1 | 5/2004 | Taskar et al. | |

(Continued)

FOREIGN PATENT DOCUMENTS

DE     196 38 667 A1     4/1998
DE     199 47 044 A1     5/2001

(Continued)

OTHER PUBLICATIONS

U.S. Appl. No. 60/745,748, filed Apr. 24, 2006.

(Continued)

*Primary Examiner* — Eric Ward
(74) *Attorney, Agent, or Firm* — Koppel, Patrick, Heybl & Philpott

(57) ABSTRACT

A light emitting diode is disclosed, together with associated wafer structures, and fabrication and mapping techniques. The diode includes an active portion, a raised border on the top surface of the active portion and around the perimeter of the top surface of the active portion, a resin in the space defined by the border and the top surface of the active portion, and phosphor particles in the resin that convert the frequencies emitted by the active portion.

21 Claims, 5 Drawing Sheets

(56) References Cited

U.S. PATENT DOCUMENTS

| | | | |
|---|---|---|---|
| 6,746,295 B2 | 6/2004 | Sorg | 445/24 |
| 6,747,406 B1 | 6/2004 | Bortscheller et al. | 313/512 |
| 6,756,058 B2 | 6/2004 | Brubaker | 424/422 |
| 6,841,934 B2* | 1/2005 | Wang et al. | 313/512 |
| 6,860,621 B2 | 3/2005 | Bachi et al. | 362/373 |
| 6,891,259 B2 | 5/2005 | Im et al. | 257/687 |
| 6,897,490 B2* | 5/2005 | Brunner et al. | 257/98 |
| 6,936,862 B1 | 8/2005 | Chang et al. | |
| 6,969,946 B2* | 11/2005 | Steranka et al. | 313/114 |
| 7,049,159 B2 | 5/2006 | Lowery | 438/22 |
| 7,051,965 B2 | 5/2006 | Nishimura | 242/310 |
| 7,122,937 B2 | 10/2006 | Hatakeyama et al. | 310/309 |
| 7,126,273 B2 | 10/2006 | Sorg | 313/512 |
| 7,148,716 B2 | 12/2006 | Schuette et al. | |
| 7,176,612 B2 | 2/2007 | Omoto et al. | 313/487 |
| 7,189,591 B2* | 3/2007 | Suehiro et al. | 438/29 |
| 7,195,944 B2 | 3/2007 | Tran et al. | 438/45 |
| 7,208,769 B2* | 4/2007 | Guenther et al. | 257/88 |
| 7,260,123 B2 | 8/2007 | Sato | 372/22 |
| 7,312,106 B2 | 12/2007 | Raben | 438/112 |
| 7,361,938 B2* | 4/2008 | Mueller et al. | 257/94 |
| 7,371,603 B2 | 5/2008 | Kim et al. | 438/64 |
| 7,510,890 B2* | 3/2009 | Ott et al. | 438/29 |
| 7,521,862 B2* | 4/2009 | Mueller et al. | 313/506 |
| 7,646,035 B2 | 1/2010 | Loh et al. | 257/99 |
| 7,655,957 B2 | 2/2010 | Loh et al. | 257/99 |
| 7,804,103 B1 | 9/2010 | Zhai et al. | 257/98 |
| 7,858,403 B2 | 12/2010 | Hiller et al. | |
| 7,910,938 B2 | 3/2011 | Hussell et al. | 257/98 |
| 7,994,531 B2 | 8/2011 | Lin et al. | 257/98 |
| 8,207,546 B2 | 6/2012 | Harada et al. | 257/98 |
| 2002/0063520 A1 | 5/2002 | Yu et al. | |
| 2002/0070449 A1 | 6/2002 | Yagi et al. | |
| 2003/0141510 A1 | 7/2003 | Brunner et al. | 257/81 |
| 2003/0218180 A1 | 11/2003 | Fujiwara | |
| 2004/0080939 A1 | 4/2004 | Braddell et al. | |
| 2004/0124429 A1 | 7/2004 | Stokes et al. | |
| 2004/0140765 A1 | 7/2004 | Takekuma | |
| 2004/0159850 A1 | 8/2004 | Takenaka | |
| 2004/0264193 A1 | 12/2004 | Okumura | 362/276 |
| 2005/0057813 A1 | 3/2005 | Hasei et al. | |
| 2005/0077529 A1 | 4/2005 | Shen | |
| 2005/0122031 A1 | 6/2005 | Itai et al. | |
| 2005/0135105 A1 | 6/2005 | Teixeira et al. | 362/294 |
| 2005/0141240 A1* | 6/2005 | Hata et al. | 362/600 |
| 2005/0199884 A1 | 9/2005 | Lee et al. | |
| 2005/0205876 A1* | 9/2005 | Harada et al. | 257/79 |
| 2005/0211991 A1* | 9/2005 | Mori et al. | 257/79 |
| 2005/0221519 A1 | 10/2005 | Leung et al. | |
| 2005/0242355 A1* | 11/2005 | Guenther et al. | 257/82 |
| 2005/0280894 A1 | 12/2005 | Hartkop et al. | 359/464 |
| 2006/0001046 A1 | 1/2006 | Batres et al. | 257/202 |
| 2006/0003477 A1 | 1/2006 | Braune et al. | |
| 2006/0034082 A1 | 2/2006 | Park et al. | |
| 2006/0060874 A1 | 3/2006 | Edmond et al. | |
| 2006/0086418 A1 | 4/2006 | Williams | |
| 2006/0097621 A1* | 5/2006 | Park et al. | 313/485 |
| 2006/0102914 A1 | 5/2006 | Smits et al. | 257/98 |
| 2006/0126326 A1* | 6/2006 | Ng et al. | 362/231 |
| 2006/0220046 A1* | 10/2006 | Yu et al. | 257/98 |
| 2006/0258028 A1 | 11/2006 | Paolini et al. | 438/22 |
| 2007/0018573 A1 | 1/2007 | Shioi | |
| 2007/0037307 A1 | 2/2007 | Donofrio | |
| 2007/0165403 A1 | 7/2007 | Park et al. | 362/247 |
| 2007/0205425 A1* | 9/2007 | Harada | 257/98 |
| 2007/0295975 A1 | 12/2007 | Omae | 257/89 |
| 2008/0006839 A1* | 1/2008 | Lin | 257/98 |
| 2008/0149956 A1* | 6/2008 | Mueller-Mach et al. | 257/98 |
| 2008/0173884 A1 | 7/2008 | Chitnis et al. | 257/98 |
| 2008/0179611 A1 | 7/2008 | Chitnis et al. | |
| 2009/0014736 A1* | 1/2009 | Ibbetson et al. | 257/98 |
| 2009/0057690 A1 | 3/2009 | Chakraborty | |
| 2009/0065791 A1 | 3/2009 | Yen et al. | 257/98 |
| 2009/0086475 A1 | 4/2009 | Caruso et al. | 362/231 |
| 2009/0117672 A1 | 5/2009 | Caruso et al. | |
| 2009/0261358 A1 | 10/2009 | Chitnis et al. | 257/88 |
| 2010/0155750 A1 | 6/2010 | Donofrio | 257/91 |
| 2010/0308361 A1 | 12/2010 | Beeson et al. | 257/98 |
| 2011/0180829 A1 | 7/2011 | Cho | |

FOREIGN PATENT DOCUMENTS

| | | | |
|---|---|---|---|
| DE | 102 37 403 A1 | 3/2004 | |
| EP | 1 059 678 A | 12/2000 | |
| EP | 1059678 | 12/2000 | |
| EP | 1198016 A2 | 4/2002 | |
| JP | H0428269 | 1/1992 | |
| JP | 11040848 | 2/1999 | |
| JP | H1140848 | 2/1999 | |
| JP | 2000-315823 | 11/2000 | |
| JP | 2000315823 | 11/2000 | |
| JP | 2002009347 | 1/2002 | |
| JP | 2003-197973 | 7/2003 | |
| JP | 2003-303999 | 10/2003 | |
| JP | 2004087812 | 3/2004 | |
| JP | 2004179343 | 6/2004 | |
| JP | 2004363343 | 12/2004 | |
| JP | 2005508093 | 3/2005 | |
| JP | 20055080093 | 3/2005 | |
| JP | 2005-298817 A | 10/2005 | |
| JP | 2005298817 | 10/2005 | |
| JP | 2006-054209 A | 2/2006 | |
| JP | 2006054209 | 2/2006 | |
| JP | 2006303373 | 11/2006 | |
| JP | 200732509 | 12/2007 | |
| JP | 2006303303 | 12/2007 | |
| JP | 2007324608 | 12/2007 | |
| WO | WO 2005101909 | 10/2005 | |
| WO | WO 2007023412 A2 * | 3/2007 | H01L 33/00 |
| WO | WO 2007049187 | 5/2007 | |

OTHER PUBLICATIONS

International Search Report and Written Opinion from PCT Appl. No. PCT/US2012/050794. dated Jan. 10, 2013.

Second Office Action from Chinese Patent Application No. 200780012387.0. dated Sep. 5, 2012.

Decision of Rejection for Japanese Patent Application No. 2009-504205. dated Jul. 31, 2012.

First Office Action from Chinese Patent Application No. 200980121201.4, dated Jul. 4, 2012.

First Office Action for European Patent Application No. 07754163.9 dated Feb. 28, 2011.

Notice of Rejection for Japanese Patent Application No. 2009-504205 issued Sep. 13, 2011.

US Patent Application Publication No. US 2011/0070668. Dated: Mar. 24, 2011 to Hiller, et al.

US Patent Application Publication No. US 2011/0070669, Dated: Mar. 24, 2011 to Hiller, at al.

Nicha Corp.. White LED, Part No. NSPW300BS, Specifications. 15 pages.

Nicha Corp., White LED. Part No. NSPW312BS. Specifications, 15 pages.

Cree, Inc., EZBright LED's. EZ1000, EZ700, EZ600, EZ400, Data Sheets.

Cree. Inc., XThin LED's, XT290, Data Sheet, 6 pages.

U.S. Appl. No. 61/072,546, filed Mar. 31, 2008, to Ashay Chitnis. at al.

Gree, Inc., EZBright290, Data Sheets.

Pi, M-501 Precision Vertical Stage, Data Sheets, 4-60 to 4-61.

Notice of Reasons for Rejection from Japanese Patent Application No. 2011-502981. dated Feb. 5, 2013.

Office Action from Korean Patent Application No. 10-2008-7026531. dated Feb. 14, 2013.

Office Action from U.S. Appl. No. 11/398,214, dated Jun. 10, 2013.

Office Action from U.S. Appl. No. 11/827,626, dated Mar. 27, 2013.

Response to OA from U.S. Appl. No. 11/827,626, filed Jun. 20, 2013.

Office Action from U.S. Appl. No. 13/192,293, dated Mar. 27, 2013.

Response to OA from Patent Appl. No. 13/192,293, filed Jun. 20, 2013.

(56) References Cited

OTHER PUBLICATIONS

Office Action from U.S. Appl. No. 13/219,486, dated Feb. 8, 2013.
Response to OA from U.S. Appl. No. 13/219,486, filed May 2, 2013.
Office Action from U.S. Appl. No. 11/827,626, dated Dec. 19, 2012.
Response to OA from U.S. Appl. No. 11/827,626, filed Feb. 8, 2013.
Office Action from U.S. Appl. No. 11/827,626. dated Sep. 17, 2012.
Response to OA from U.S. Appl. No. 11/827,626, filed Dec. 4, 2012.
Office Action from U.S. Appl. No. 13/219,486, dated Aug. 21, 2012.
Response to OA from U.S. Appl. No. 13/219,486, filed Dec. 18, 2012.
Office Action from U.S. Appl. No. 13/219,486, dated Apr. 19, 2012.
Response to OA from U.S. Appl. No. 13/219,486, filed Jul. 12, 2012.
Office Action from U.S. Appl. No. 11/827,626, dated Sep. 28, 2011.
Response to OA from U.S. Appl. No. 11/827,626, filed Feb. 22, 2012.
Office Action from U.S. Appl. No. 11/398,214, dated Apr. 25, 2011.
Response to CA from U.S. Appl. No. 11/398,214, filed Aug. 23, 2011.
Office Action from U.S. Appl. No. 12/414,457. dated Apr. 1, 2011.
Response to OA from U.S. Appl. No. 12/414,457, filed Jul. 1, 2011.
Office Action from U.S. Appl. No. 12/414,457, dated Nov. 12, 2010.
Response to OA from U.S. Appl. No. 12/414,457, file Jan. 11, 2011.
Office Action from U.S. Appl. No. 12/414,457. dated Jun. 29, 2010.
Response to OA from U.S. Appl. No. 12/414,457, file Oct. 25, 2010.
Third Office Action from Chinese Patent Appl. No. 2007800123870, dated Feb. 14, 2013.
Second Office Action from Chinese Application No. 200980121201.4, Dated: Mar. 5, 2013.
Interrogatory from Japanese Patent Appl. No. 2009-504205, dated Mar. 19, 2013.
Rejection Decision from Chinese Patent Appl. No 200980121201.4. received Sep. 23, 2013.
Decision of Rejection from Japanese Patent Appl. No. 2011-502981, dated Sep. 10, 2013.
Examination Report from European Patent Appl. No. 07 754 163.9-1564. dated Oct. 14. 2013.
Allowed Claims from Taiwanese Patent Appl. No. 096111808, dated Jun. 6. 2014.
Office Action from U.S. Appl. No. 12/414,457, dated Jul. 18, 2013.
Response to OA from Patent Appl. No. 12/414,457, filed Oct. 17, 2013.
Office Action from U.S. Appl. No. 11/398,214, dated Mar. 7, 2014.
Extended European Search Report from European Patent Appl. No. 08160051.2-1551, dated Apr. 24, 2014.
Office Action from U.S. Appl. No. 11/398,214. dated Nov. 22, 2013.
Response to OA from U.S. Appl. No. 11/398,214, filed Jan. 14, 2014.
Office Action from U.S. Appl. No. 11/827,626, dated Jun. 12, 2014.
Response to OA from U.S. Appl. No. 11/827,626, filed Aug. 8, 2014.
Office Action from U.S. Appl. No. 11/398,214, dated Jun. 12, 2014.
Examination Report from European Patent Appl. No. 09728238.8. dated Aug. 6, 2014.
Office Action from Taiwanese Patent Appl. No. 096111808, dated Nov. 7, 2013.
Notice of Reexamination from Chinese Patent Appl. No. 200980121201,4. dated Jan. 16, 2015.
Examination Report from European Appl. No. 09 728 238.8, dated Jan. 5, 2015.
Office Action from U.S. Appl. No. 11/827,626, dated Feb. 5, 2015.
Decision of Grant from Japanese Patent Appl. No. 2011-502981, dated Sep. 1, 2015.
Office Action from U.S. Appl. No. 11/827,626: Feb. 1, 2016.
Office Action from Korean Patent Appl. No. 10-2010-7024150, dated Mar. 16, 2015.
Office Action from U.S. Appl. No. 11/827,626. dated May 22, 2015.
Notice of Reasons for Rejection from Japanese Appl. No. 2011-502981, dated May 12, 2015.
Summons to attend oral proceedings from European Patent Appl. No. 07754163.9. dated Oct. 8, 2015.
Third Office Action from Chinese Patent Appl. No. 200980121201.4, dated Oct. 9, 2015.
Office Action for Application No. 07754163.9; Dated Apr. 8, 2016.
Office Action for Application No. 200980121201.4; Dated Mar. 4, 2016.
Office Action from U.S. Appl. No. 11/827,626; May 12, 2016.
Office Action for application No. 08160049.6; Dated May 6, 2016.

* cited by examiner

LED CHIP DESIGN FOR WHITE CONVERSION

BACKGROUND

The present invention relates to light emitting diodes. In particular, the invention relates to light emitting diodes that emit in relatively high frequencies within the visible spectrum (e.g., blue and violet) and that are used in conjunction with phosphors that convert some of the light generated by the LEDs into complementary colors that together with the LED light produce white output.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

Light emitting diodes share a number of the favorable characteristics of other semiconductor devices. These include generally robust physical characteristics, long lifetime, high reliability, and, depending upon the particular materials, low cost.

A number of terms are used herein that are common and well-understood in the industry. In such industry use, however, these terms are sometimes informally blended in their meaning. Accordingly, these terms will be used as precisely as possible herein, but in every case their meaning will be clear in context.

Accordingly, the term "diode" or "chip" typically refers to the structure that minimally includes two semiconductor portions of opposite conductivity types (p and n) along with some form of ohmic contacts to permit current to be applied across the resulting p-n junction.

The term "lamp" is used to designate a light emitting diode that is matched with an appropriate electrical contact and potentially a lens to form a discrete device that can be added to or included in electrical circuits or lighting fixtures or both.

As used herein, the term "package" typically refers to the placement of the semiconductor chip on an appropriate physical and electrical structure (sometimes as simple as a small piece of metal through which the electrical current is applied) along with a plastic lens (resin, epoxy, encapsulant) that provides some physical protection to the diode and can optically direct the light output. The package often includes a reflective structure, frequently formed of a polymer within which the diode rests. Adding a lens and electrical contacts typically forms a lamp.

Appropriate references about the structure and operation of light emitting diodes and diode lamps include Sze, PHYSICS OF SEMICONDUCTOR DEVICES, 2d Edition (1981) and Schubert, LIGHT-EMITTING DIODES, Cambridge University Press (2003).

The color emitted by an LED is largely defined by the material from which it is formed. Diodes formed of gallium arsenide (GaAs) and gallium phosphide (GaP) tend to emit photons in the lower energy (red and yellow) portions of the visible spectrum. Materials such as silicon carbide (SiC) and the Group III nitrides (e.g., AlGaN, InGaN, AlInGaN) have larger bandgaps and thus can generate photons with greater energy that appear in the green, blue and violet portions of the visible spectrum as well as in the ultraviolet portions of the electromagnetic spectrum.

In some applications, an LED is more useful when its output is moderated or converted to a different color. In particular, as the availability of blue-emitting LEDs has greatly increased, the use of yellow-emitting phosphors that down-convert the blue photons has likewise increased. Specifically, the combination of the blue light emitted by the diode and the yellow light emitted by the phosphor can create white light. In turn, the availability of white light from solid-state sources provides the capability to incorporate them in a number of applications, particularly including illumination and as lighting for color displays.

Several types of structures are currently used for color conversion in white-emitting LEDs. In one structure and related technique, the LED chip is placed on a package and then substantially or entirely covered with a polymer resin that carries a dispersed phosphor and that forms the lens portion of the LED lamp. Although this is a straightforward structure and process, it produces a relatively high variation in color across the diode.

In another technique, the phosphor is deposited directly upon or very near the chip surface, after which the lens resin is applied to fix the phosphor in place. This produces better color uniformity (lower CCT variation), a brighter output, and less undesired scattering. The corresponding disadvantage, however, is that the phosphor must be positioned precisely during the fabrication process, thus increasing the cost of the process and of the resulting diodes.

In a third option, the phosphor is applied in a "mini-glob;" i.e., as a small amount of resin carrying a dispersed phosphor that is applied only to the surface of the LED chip. In a separate step, polymer resin without phosphor is added to produce the final lens and package. The mini-glob technique is relatively easy from a fabrication standpoint, tends to be less expensive, and offers a good compromise as between the dispersed resin technique and the phosphor-on-chip technique. The corresponding problem, however, is that the geometry of the chip and the mini-glob (e.g., FIG. 1) results in a higher than desired emission of unconverted blue light. The mini-glob technique also depends on defining a meniscus of the resin that holds the phosphor. The outer edge of the chip is the easiest manner of defining such a meniscus, but this produces a lack of output uniformity based upon the absence of phosphor at the edge of the meniscus.

In a fourth option, a resin and phosphor are cast or molded into a pre-form (e.g., in the shape of a solid rectangle). The pre-form is then positioned adjacent the LED chip during the fabrication process. This produces a bright and dense output, but represents a relatively difficult fabrication. Accordingly, the fabrication and diode costs are relatively high. Additionally, the pre-form technique produces a diode geometry that tends to suffer from the same blue leakage as the mini-glob technique. Another problem with the pre-form technique arises from the current spreading fingers that are typically used on an active layer, particularly a p-type active layer. These fingers tend to prevent the pre-forms from resting flush on the diode chip. The resulting gap between the pre-form and the diode surface allows high angle blue light to escape without interacting with the pre-form.

Representative descriptions of several of these structures are set forth in commonly-assigned and copending application Ser. No. 60/745,478 for, "Side View Surface mount White LED," the contents of which are incorporated entirely herein by reference. Other representative packages include (but are not limited to) U.S. Patent Application Publication No. 20050199884.

The phosphors themselves raise another potential problem. As generally well understood in the art, a phosphor is a solid material that absorbs photons of one frequency and then emits photons of a different (typically lower energy) frequency or range of frequencies. When blue light emitting diodes are used to produce white light, yttrium aluminum garnet (YAG), often cerium doped, represents a useful and exemplary phosphor. In use, YAG absorbs the blue frequencies such as those emitted by Group III nitride LEDs and converts the energy into a range of lower frequencies, with yellow being predominant. The combination of blue light from the LED and yellow from the phosphor produces an overall white emission.

Conventionally, phosphors are produced by mixing the relevant precursors and sintering them under pressure at relatively high temperatures (e.g. 1000° C.) and then mechanically milling the sintered product. This produces a powder that can be incorporated into the resin lens on an LED chip.

In the LED context, phosphor particles smaller than a certain size tend to avoid dispersing properly in the encapsulant, tend to exhibit a higher proportion of surface defects, and are less efficient in terms of white conversion and output. Thus, the phosphor particle size (based on the rough diameter across the particle) should be more than at least about 1 micron (μm) and preferably greater than 2 μm to maximize efficiency. In many LED applications, phosphor particle sizes in the 2-25 μm range are generally preferred.

These sizes are, however, large enough to be proportionally similar to certain dimensions of the LED chip. For example, and as illustrated in FIG. 1, larger particles are difficult or impossible to position at the edge of a mini-glob thus exacerbating the blue leakage problem.

The blue light problem is also exacerbated because in a diode formed from a plurality of epitaxial layers, the majority of light is emitted in a generally vertical direction; i.e., if the surface of the diode chip were considered to be horizontal, then most of the light is emitted within about 70° degrees of a line perpendicular to the horizontal surface. As a result, the phosphor particles are generally positioned to interact most efficiently with the more perpendicular emissions.

Additionally, the power emitted at angles closer to the horizontal (i.e., within about 20° of the horizontal surface) is generally lower than the power emitted vertically which adds to the difficulty in balancing the conversion of the blue light with the phosphor.

SUMMARY

In one aspect the invention is a light emitting diode that includes an active portion, a raised border on the top surface of the active portion and around the perimeter of the top surface of the active portion. A resin is in the space defined by the border and the top surface of the active portion and phosphor particles are in the resin to convert the frequencies emitted by the active portion.

In another aspect, the invention is a semiconductor precursor wafer. In this aspect, the invention includes a substrate, a plurality of LED chip precursors on the wafer, with a plurality of the chip precursors having a perpendicular-oriented border along the perimeter of the LED chip surface. A plurality of the bordered chip precursors are filled with a polymer resin and a plurality of the resin-filled precursors have a phosphor in the resin.

In another aspect, the invention is a light emitting diode structure that includes an active portion, a raised border on the top surface of the active portion and around the perimeter of the top surface of the active portion, a resin pre-form resting on the raised border and above the top surface of the active portion, and phosphor particles in the resin pre-form that convert the frequencies emitted by the active portion.

In another aspect, the invention is a method of tuning a light emitting diode by output. In this aspect, the invention comprises measuring a quantity selected from the group consisting of color, radiant flux, and combinations thereof produced by a light emitting diode. The diode is then covered with an amount of phosphor combined with a polymer resin that produces a selected color based upon the measured color from the diode and the added phosphor in the resin In yet another aspect, the invention comprises a method of categorizing light emitting diodes by output. In this aspect, the invention includes the steps of probing a wafer that includes a plurality of LED precursors to measure a quantity selected from the group consisting of wavelength, radiant flux, and combinations thereof. A map is then created of the probed wafer according to the measured quantity, and an amount of phosphor in a resin is added to individual diodes on the wafer based upon the mapped output. The diodes are then separated and sorted by output.

In yet another aspect, the invention is a method of forming a color-conversion light emitting diode. In this aspect, the invention comprises forming a raised border around the perimeter of the top surface of a light emitting diode chip and then filling the well created by the raised border with a polymer resin carrying a dispersed phosphor that is responsive to the frequencies emitted by the diode chip and that emits responsive frequencies that are different from the frequencies emitted by the diode chip.

The foregoing and other objects and advantages of the invention and the manner in which the same are accomplished will become clearer based on the followed detailed description taken in conjunction with the accompanying drawings.

DETAILED DESCRIPTION

Figure 7:
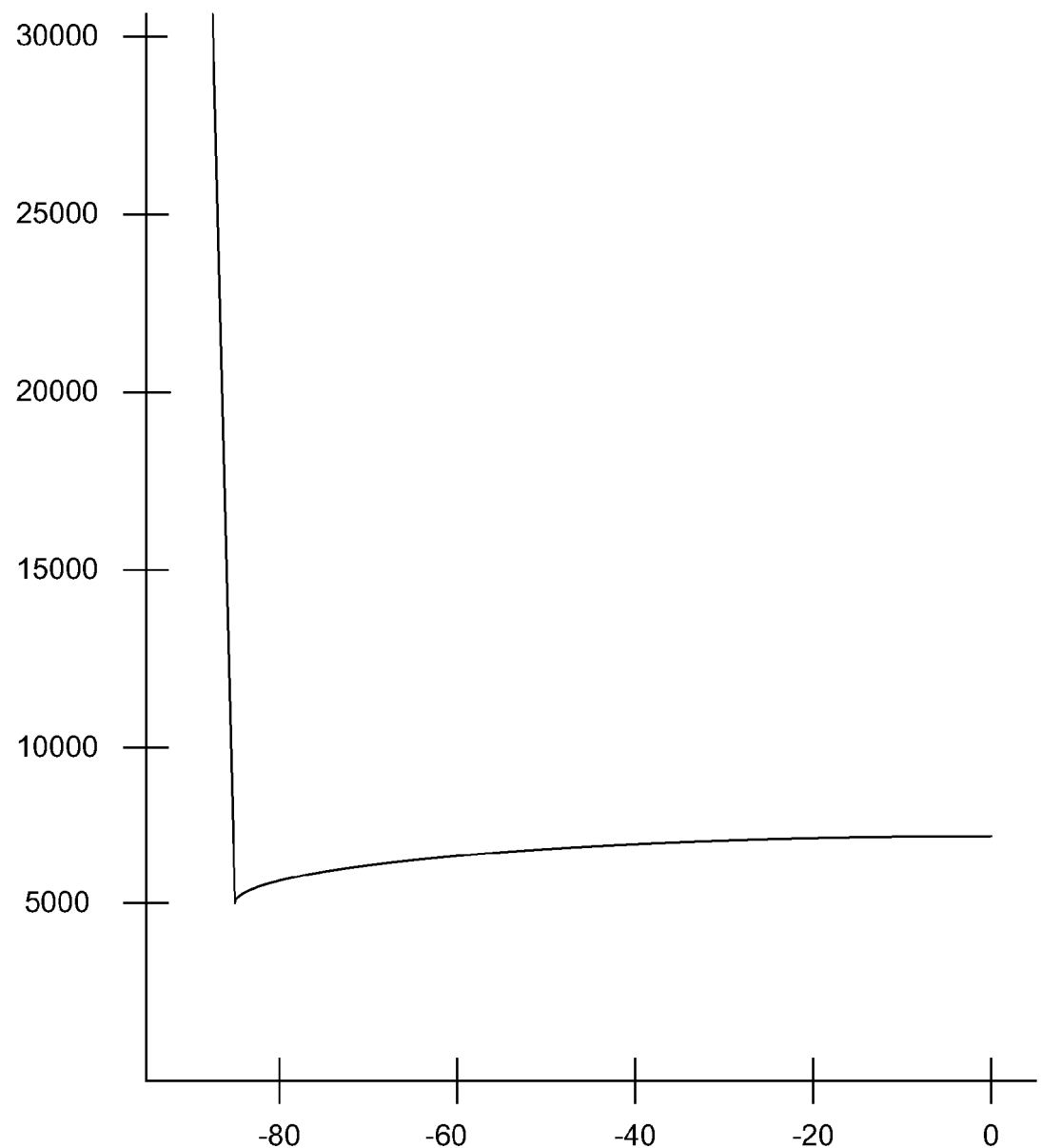
FIG. 7 is a plot of color temperature versus chip geometry for prior art diodes.

The present invention is a light emitting diode structure and in particular relates to the mini-glob type of structure referred to in the Background. To some extent, the invention can be understood with respect to certain aspects of the prior art. Accordingly, FIGS. 1 and 7 illustrate representative structures and characteristics of the prior art.

Figure 1:
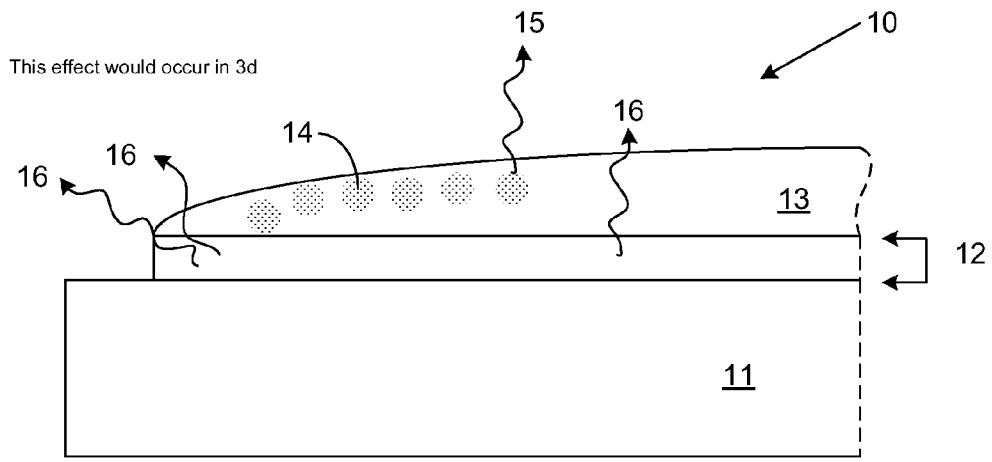
FIG. 1 is a cross-sectional schematic view of a portion of a prior art mini-glob diode structure.

FIG. 1 is a schematic cross-sectional diagram of a light emitting diode broadly designated at 10. It will be understood that FIG. 1, and the other figures herein, are schematic in nature for the purpose of illustrating certain aspects of the art and of the invention. Additionally, FIGS. 1-5 are partial cross-sections rather than complete cross-sections of the given diodes that they illustrate.

In FIG. 1, the diode 10 includes a substrate 11 and an active portion indicated by the arrows 12. In most circumstances, the active portion 12 will include at least two epitaxial layers that together form a p-n junction that emits photons when current is applied across the junction.

FIG. 1 illustrates a mini-glob diode, a term which is used herein descriptively rather than for purposes of limitation. The term refers to the droplet of resin illustrated at 13 that is applied to and covers the surface of the active portion 12. The droplet 13 carries phosphor particles indicated by the dotted circles 14. As noted earlier, the phosphor particles 14 tend to work better for their intended purpose when they are relatively large. Thus, as schematically illustrated in FIG. 1, the mini-glob structure tends to include a portion of the droplet 13 near its edge where phosphor particles are too large to fit.

The phosphor particles 14 are included for the purpose of generating an emission, symbolized by the arrow 15. In the case of white light emitting diodes, the active portion 12 tends to generate a blue emission symbolized by the arrows 16 and the phosphor particles 14 generate a yellow emission, the combination of which produces white light. At the edge of the active portion, the resin geometry is too small to include phosphor particles 14 and thus the predominant emission is in the color (e.g. blue) generated by the active portion, rather than the desired blend of colors from both the active portion 12 and the phosphor particles 14.

FIG. 7 schematically illustrates the effect on output in a representative, rather than exact, plot of color temperature versus chip geometry. In FIG. 7 the y-axis represents color temperature and the x-axis represents the relative position on a chip, with 0 representing the center and −80 representing a position near the chip edge. The color temperatures (in the standard unit of Kelvin, K) are taken from the well understood CIE color temperature diagram. In this system, color temperature is a simplified manner of characterizing the spectral properties of a light source. Technically, the color temperature refers to the temperature to which a black body source would need to be heated to produce light of the indicated color.

Using this system, color temperatures of about 2500-10,000 K represent various tones of white light. As FIG. 7 illustrates, however, near the edge of the diode chip, the color temperature increases rapidly to over 30,000 K; i.e. a blue emission. The net effect is a white or yellowish-white diode with a blue emitting edge.

Figure 2:
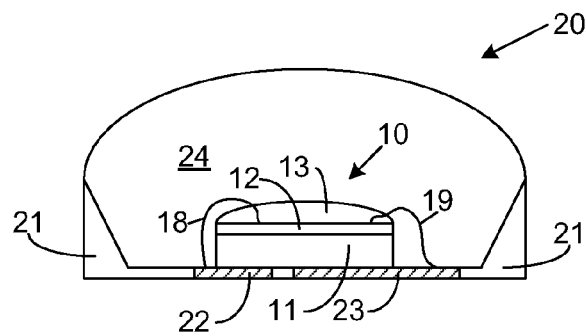
FIG. 2 is a cross-sectional schematic view of a representative LED lamp.

FIG. 2 places FIGS. 1 and 3-5 in context. Shown schematically, the mini-glob 13 gives FIG. 1 the superficial appearance of an LED lamp. In reality, however, FIGS. 1 and 3-5 illustrate LED chips. FIG. 2 clarifies the distinction by illustrating an LED lamp broadly designated at 20. The lamp 20 includes a package or header 21 and metal contacts 22 and 23 upon which the LED chip 10 (or one of the chips described later herein) is positioned. Respective wires 18 and 19 (or equivalent structures) connect the active portion 12 to the contacts 22 and 23. A lens 24 covers the chip 10 and all of the other elements described with respect to FIG. 1. The lens 24 may be made of the same or a different resin from that of the droplet 13.

Figure 3:
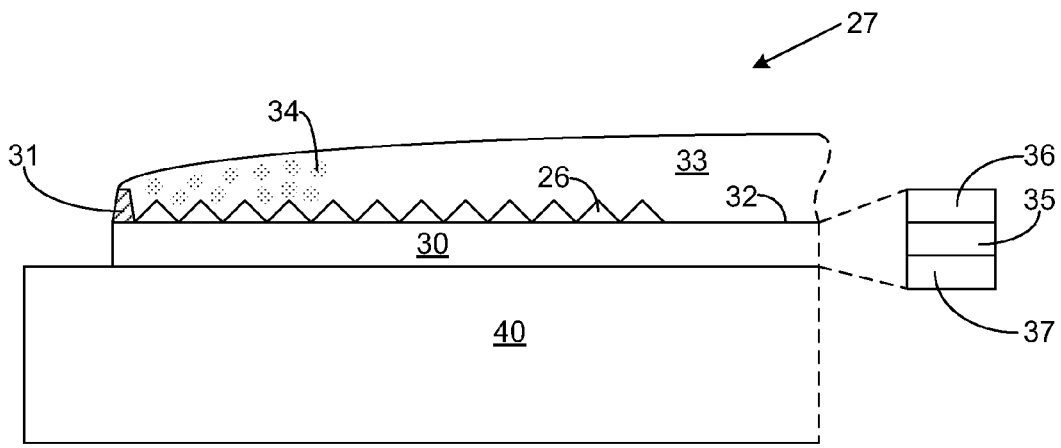
FIG. 3 is a cross sectional schematic view of a portion of a mini-glob diode according to the present invention.
Figure 4:
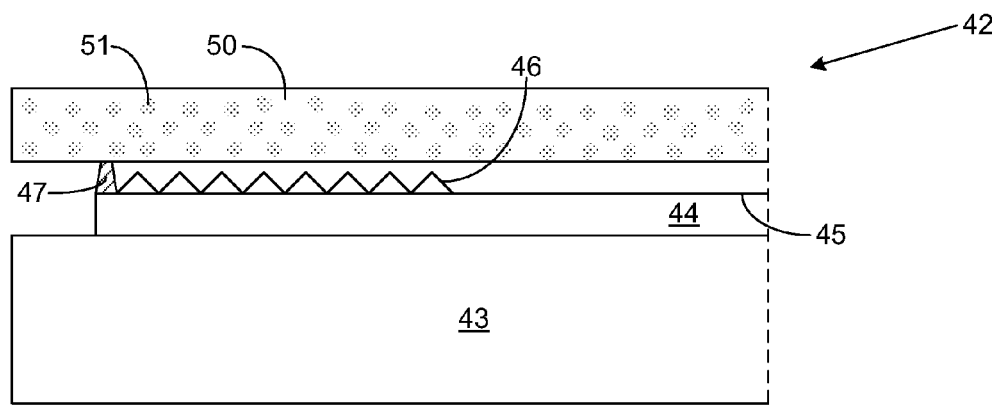
FIG. 4 is a cross-sectional diagram of a pre-form diode structure according to the present invention.
Figure 5:
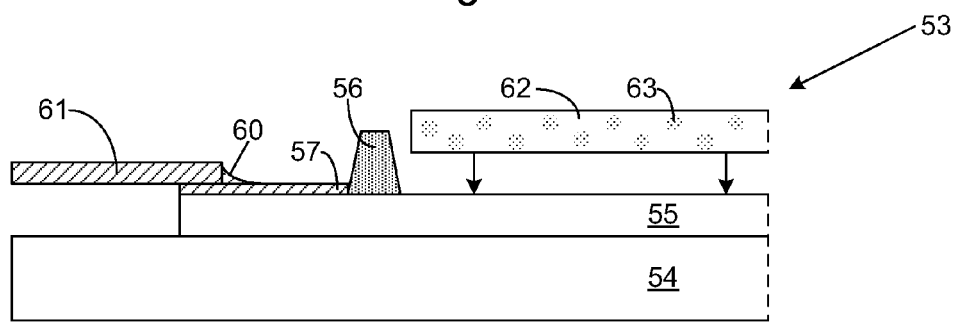
FIG. 5 is a cross-sectional schematic diagram of a second version of a pre-form diode structure according to the present invention.

FIGS. 3, 4 and 5 illustrate LED chip embodiments according to the present invention. Starting with FIG. 3, a light emitting diode is broadly designated at 27 and includes an active portion 30. A raised border 31 is on, generally perpendicular to, and around the perimeter (e.g. FIG. 6) of, the top surface 32 of the active portion 30. In exemplary embodiments, the raised border is on the order of about 50 microns high. A resin 33 fills the space defined by the border 31 and the top surface 32. The phosphor particles 34 are in the resin 33 and represent a phosphor that will convert frequencies emitted by the active portion 30.

As used herein, the term "perpendicular-oriented" is not limited to 90° angles and can also refer to a physical edge or edge structure that extends upwardly from the chip and that will help retain the polymer resin in the described and illustrated manner. Thus (for example), a border that included an edge set at 45° relative to the chip surface would necessarily include portions that were perpendicularly above the chip surface and that served to retain the resin in place on the chip with more than just the meniscus.

Similarly, as used herein, the phrase "around the perimeter" is descriptive rather than limiting of the invention. Thus, the raised border need not align perfectly with the perimeter, and borders set marginally inside the chip perimeter will serve the intended purpose.

As set forth in the background, because the invention offers advantages in the production of white light emitting diodes, the active portion 30 is typically formed from the Group III nitride material system. As indicated by the breakout portion of FIG. 3, in many circumstances, the active portion will include a double heterostructure of at least one layer 35 of indium gallium nitride (InGaN) between adjacent layers 36 and 37 of gallium nitride (GaN). The GaN layers 36 and 37 are doped oppositely from one another (i.e., one is n-type and one is p-type) to provide for current injection across the active layer 35.

Those familiar with light emitting diodes will recognize that the active portion 30 can also include homojunctions, single heterojunctions, superlattice structures and multiple quantum wells.

When indium gallium nitride is used as the active layer 35, an atomic fraction of indium of about 0.2 (i.e., $In_{0.2}Ga_{0.8}N$) is typically preferred because it provides a desired output and because larger atomic fractions of indium tend to form less stable compounds.

In FIG. 3 the active portion 30 is positioned upon a substrate or other supporting structure 40 which is most typically selected from the group consisting of silicon carbide, sapphire, and sub-mounting structures. Each of these has respective advantages that are well understood in the art. Silicon carbide can be conductively doped to provide a vertically oriented diode. Sapphire has favorable optical characteristics, but cannot be conductively doped and thus limits the structure to horizontal geometries. Sub-mounting structures can be formed of a number of materials and offer advantages in terms of the fabrication, heat transfer properties and geometries of the diodes in the diode lamps.

The raised border 31 is typically selected from the group consisting of metals, semiconductors and ceramics. Metals can be deposited in a well-understood manner analogous to other types of semiconductor patterning and lithography. Semiconductors and ceramics can be applied with generally well-understood deposition and etching steps to produce the desired structure in a manner directly analogous to forming other structures of similar size. The border can also be formed by dispensing a solder and then reflowing it in a well understood technique or by depositing or molding a ceramic such as aluminum oxide ($Al_2O_3$), titanium dioxide ($TiO_2$), or silicon dioxide ($SiO_2$). These compositions are typically white in color with high reflectivity and thus help with the light scattering function of the raised border.

As FIG. 3 illustrates, the raised border 31 permits the droplet 33 of resin to fill a well rather than to form a meniscus at the chip edge. As a result, the thickness or depth of the resin 33 at the edge of the active portion 30 can be greater (higher) against the raised border 31 than it could be if it formed a meniscus against the chip surface 32 (e.g., FIG. 1). This in turn allows more and larger particles of the desired phosphor to be present at the physical edge of the active portion 30. This in turn minimizes or eliminates the possibility that photons from the chip or active portion 30 will be emitted without interacting with the phosphor 34 or blending with the yellow frequencies emitted by the phosphor 34. The invention also permits a flat-fill (rather than domed) mini glob technology if desired.

Additionally, in diodes of this type, a higher percentage of vertical light is easier to manage and the invention helps provide this advantage.

In exemplary embodiments (e.g., the Group III nitrides), the active portion 30 emits in the blue portion of the visible spectrum and the phosphor 34 down-converts the blue emission from the diode into predominantly yellow frequencies.

Because of the expected frequencies, the resin 33 is typically selected from the group consisting of polymethylmethacrylate (PMMA), polycarbonate, polysiloxane and polyester. The polysiloxane resins are particularly advantageous for the resin 33 because they are less affected by the relatively high energy blue photons produced by the Group III nitride material system. Similarly, yttrium aluminum garnet ("YAG", usually doped with cerium) represents an exemplary phosphor for down-converting the blue frequencies into predominantly yellow frequencies.

It will be understood, however, that although producing white light from the combination of a blue light emitting diode and a yellow phosphor is particularly useful, the structural aspects of the invention are not limited to these colors. Accordingly, phosphors that emit other colors, or LEDs that emit other colors, can be combined to produce desired output colors (e.g., CIE chromaticity coordinates). Additionally, the term "white" is somewhat subjective and different end users may desire or require specific hues that can be produced with specific LED-phosphor combinations. Furthermore, the white output from several different lamps can be combined to produce a final "white" (or any other color choice) at the system level.

FIG. 3 also illustrates that the diode 27 can include a lenticular surface 26 for increasing the light extraction from the active region. Representative surfaces include, but are not limited to, those described in U.S. Patent Application Publication No. 20070037307, the contents of which are incorporated entirely herein by reference.

FIGS. 4 and 5 illustrate embodiments that use a pre-form version of the technology. FIG. 4 illustrates a chip at 42 that includes a substrate 43 (or equivalent sub-mounting structure) and an active layer (or layers) 44. As in FIG. 3, the surface 45 of the active portion 44 can include lenticular features 46. The raised border is illustrated at 47. In the embodiment illustrated in FIG. 4, the raised border 47 does not need to be continuous around the edge of the chip because it does not need to hold a droplet of liquid resin as part of the fabrication process. Instead, a solid pre-form 50 carrying the phosphor particles 51 rests on the raised border 47. In a manner analogous to the advantages of the previous embodiment, this permits the pre-form 50 to match or exceed the size of the top surface 45 of the active portion 44. This in turn minimizes or eliminates the possibility that photons (again typically blue photons) from the active portion 44 will be emitted without either blending with yellow light from the phosphor 51 or being converted from blue frequencies into yellow frequencies by the phosphor 51.

FIG. 5 illustrates some of the other advantages that can be provided by the raised border. In FIG. 5, the diode is broadly designated at 53 and again includes a substrate 54 and an active portion (or layers) 55. The raised border (and it will be understood that the drawing is not necessarily to scale) is illustrated at 56. An ohmic contact 57 is made to the active portion 55 and is further connected, typically with solder 62 and a wire or equivalent 61. The absence of any such structures inside of the raised border 56 greatly simplifies the task of positioning either a droplet or the perform 62 onto the relevant part of the active portion 55.

In addition to the optical advantages described with respect to FIGS. 3 and 4, in this diode 53 the raised border 56 defines a space free of any wire bond structure or geometry into which the phosphor-carrying resin can be added. The resin and phosphor can be added either as a droplet analogous to FIG. 3 or as the pre-form 62 illustrated in FIG. 5 with the phosphor particles 63.

FIG. 5 illustrates the ohmic contact 57 outside of the raised border 56. Additionally, the LED 53 could have a center bond pad which could be raised to the level of the border 56 and with phosphor and resin filling the border around the centered ohmic contact. A wire bond connection could then be made to the center raised post. This could be made, for example, by bump bonding the center bond pad, filling the well with the phosphor-encapsulation mix, and then wire bonding to the top of the bump pad.

Figure 10:
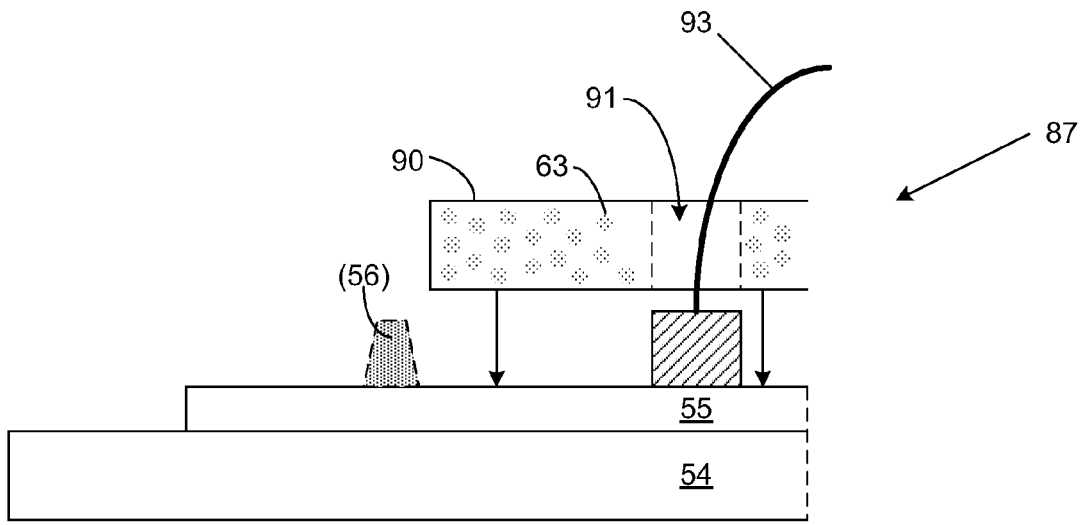
FIG. 10 is a cross-sectional view of another embodiment of the diode structure according to the present invention.
Figure 11:
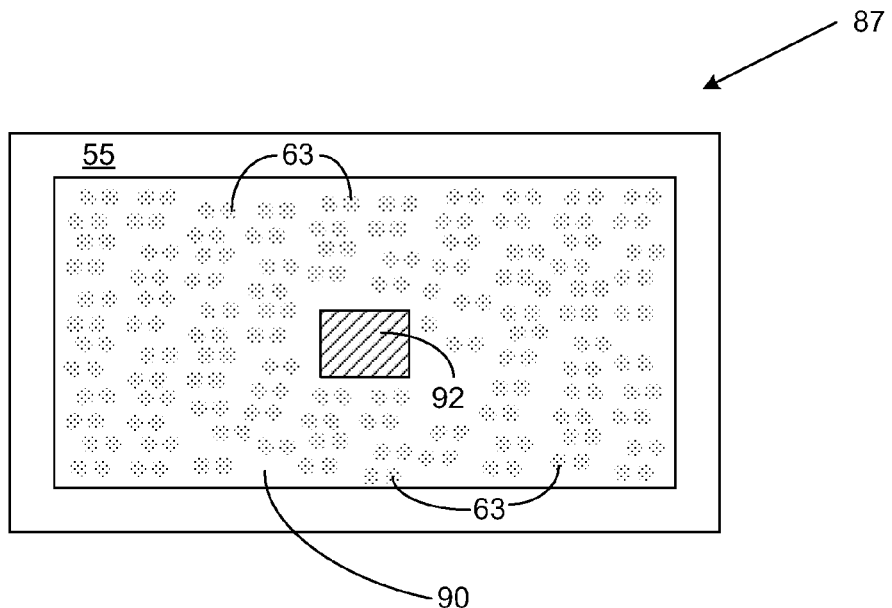
FIG. 11 is a top plan view of the diode structure illustrated in FIG. 10.

FIGS. 10 and 11 illustrate another manner of using the preform. In this embodiment, the diode is broadly designated at 87 and includes the substrate 54 and active portion 55 in a manner directly analogous to the embodiment illustrated in FIG. 5. In this embodiment, however, the preform 90 carrying the phosphor particles 63 includes a cut out 91 that substantially matches an interior bond pad 92 on the active portion 55. The cutout 91 and the bond pad 92 are shaped and sized to register with one another so the preform can be pressed or otherwise placed on the bond pad 92. FIG. 10 illustrates the bond pad 92 in square cross-section, but it will be understood that when taken in top plan view (e.g. FIG. 11), the bond pad 92 could be circular, square, rectangular or some other appropriate shape. In this embodiment, the raised border 56 can be optional because the registration between the interior bond pad 92 and the opening 91 in the preform 90 produces the intended positioning of the phosphor 63 with respect to the active portion 55. A wire 93 provides an electrical connection to the diode 87 in an otherwise conventional manner.

The relevant materials for the embodiment shown in FIGS. 4 and 5 can be the same as those described with respect to FIG. 3. Thus, the active portions 44 and 55 are typically formed from Group III nitride material system and emit in the blue portion of the visible spectrum. The phosphor 51 and 63 is typically cerium-doped YAG and emits predominantly in the yellow portion of the spectrum. The substrates 43 and 54 can again be selected from among silicon carbide, sapphire, and other sub-mounting structures. The resin pre-forms 50 and 62 respectively can be formed of any of the indicated (or other) relevant resin, with the polysiloxanes being particularly advantageous because of their stability with respect to high frequency blue emissions.

Figure 6:
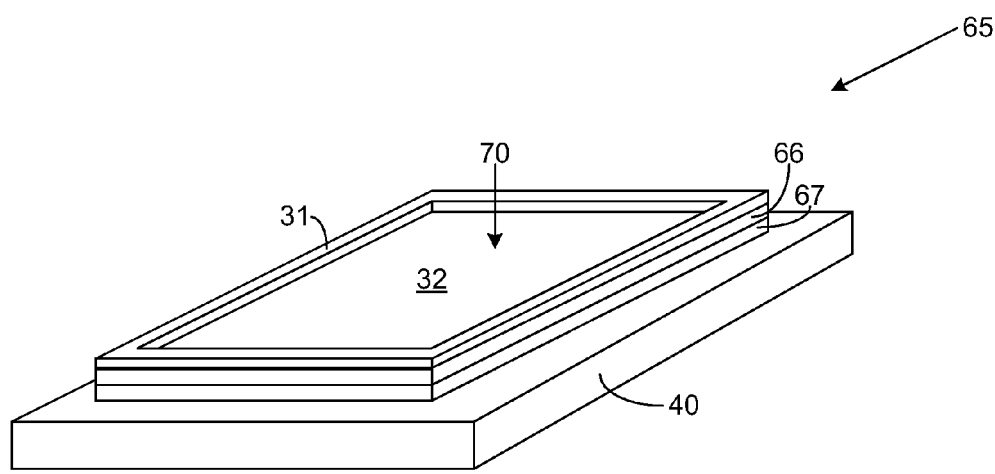
FIG. 6 is a perspective view of a diode structure according to the present invention.

FIG. 6 is a schematic diagram of a diode precursor broadly designated at 65 illustrating some of the elements from FIGS. 3, 4 and 5 in perspective fashion. In particular, and with the reference to FIG. 3, the diode 65 includes the substrate 40 and two active layers illustrated at 66 and 67. The raised border 31 and the top surface 32 of the active portion formed by the epilayers 66 and 67 define a well 70 into which the droplet of phosphor-containing resin can be placed with the advantages just described. Additionally, FIG. 6 illustrates how a pre-form such as those illustrated in FIGS. 4 and 5 (50 and 62 respectively) can be supported on the raised border 31.

Figure 8:
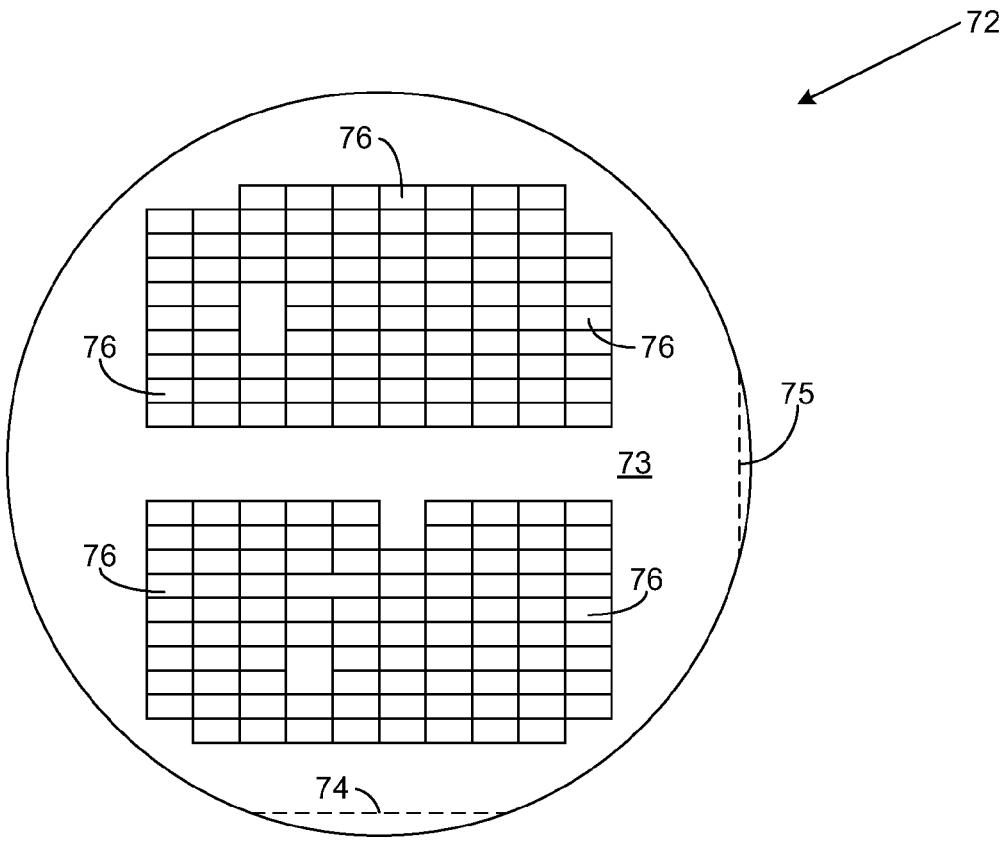
FIG. 8 is a schematic diagram of a wafer and associated diode precursors according to the present invention.

In another aspect, the invention is a semiconductor precursor wafer. Aspects of this embodiment are illustrated in FIG. 8 which is a schematic top plan view of a wafer broadly designated at 72. In many circumstances, the wafer is not entirely circular, but includes one straight edge 74 referred to as the primary flat, and a second straight edge 75 referred to as the secondary flat. The straight edge of the primary flat is typically oriented so that the chord is parallel with a specified index crystal plane. The secondary flat is typically shorter than the primary flat and its position with respect to the primary flat identifies the face of the wafer.

The wafer 72 includes a plurality of LED chip precursors 76 on the substrate 73. It will be understood that in the schematic view of FIG. 8, the individual LED chip precursors are illustrated as proportionally large rather than to actual scale. As in actual practice, some positions exist where flaws or defects prevent the completion of an LED precursor (or produce a defective precursor) and these are schematically represented by the empty positions. The chip precursors are typically formed of epitaxial layers of the light emitting semiconductor and potentially include some metal layers (for immediate or eventual electrical contact) and potentially some isolation structure for separating the individual diodes 76 from one another. These isolation structures can include edge trenches or deposited passivation materials, both of which are generally well understood in the art and will not be described in detail herein.

A plurality, and preferably all, of the chip precursors 76 include the raised border described with respect to the individual chip embodiments. In turn, a plurality (and preferably all) of the bordered chip precursors are filled with the polymer resin and a plurality (and preferably all) of the resin filled chip precursors include a phosphor in the resin.

As in the earlier embodiments, the substrate is typically selected from among silicon carbide, sapphire and sub-mounting structures and the chips are formed from the Group III nitride material system.

Because each chip precursor 76 contains the raised border, the invention provides some fabrication advantages over conventional techniques. For example, in some embodiments each of the chip precursors 76 includes an identical composition of phosphor and an identical amount of the phosphor in the resin. Alternatively, in other embodiments different chip precursors can include different amounts of the phosphor, or different phosphor compositions, or different resin compositions, or combinations of these differences.

As in the previous embodiments, the resins are selected from among the group consisting of PMMA, polycarbonate, polysiloxane, and polyester. The raised borders are again selected from the group consisting of metals, semiconductors and ceramics.

In the preferred embodiments, the chip precursors emit in the blue portion of the spectrum and the phosphor down-converts the blue frequencies into predominantly yellow portions of the visible spectrum.

The structural features of the invention in turn provide the opportunity for novel methods of categorizing both individual diodes and groups of light emitting diodes. Thus, and again using FIG. 8 as an example, the invention is a method that includes the steps of probing the wafer 72 that includes the plurality of LED precursor 76 to measure a quantity selected from the group consisting of wavelength, radiant flux, and combinations of these properties. The method then includes the step of creating a map of the probed wafer according to the measured quantity and adding an amount of phosphor in a resin to individual diodes on the wafer based upon the mapped output. The diodes can then be separated and sorted by output.

This offers the advantage of categorizing diodes by color while they are on the wafer rather than after they have been separated and packaged. Sorting the diodes at the wafer structure, rather than after they are separated, has significant advantages in efficiency and yield of the fabrication process.

Stated differently, the blue frequencies range from about 455 to about 490 nanometers within the visible spectrum. For a number of reasons, the emissions from individual diodes can differ from diode to diode across a single wafer. Thus, the probing step (the term "probing" being used generally rather than specifically) can be used to identify the different blue frequencies emitted by the individual diodes (or groups of diodes). Based upon the different emissions, the composition or amount (or both) of phosphor added to each individual diode can be tailored to that diode while the diode is still on the wafer to produce the desired light output.

As an alternative or complementary step, the wafer can also be probed and mapped according to color after the phosphor has been added to the diode precursors. Stated differently, the diodes can be mapped according to their blue emission before the phosphor is added, or they can be mapped according to their white emission after the phosphor has been added, or both.

As described earlier, the phosphor can be added as a liquid droplet carrying the phosphor, as a pre-form.

Although the invention offers particular advantages for tailoring the output of diodes while they are on the wafer, such tailoring can also be applied to individual diodes in an entirely analogous manner.

In yet another aspect, the invention comprises the method of forming the color conversion light emitting diode. In this aspect, the invention includes the steps of forming the raised border around the perimeter of the top surface of the diode chip and then filling the well created by the raised border with the polymer resin carrying the dispersed phosphor that is responsive to the frequencies emitted by the diode chip and that emits response to frequencies that are different from the frequencies emitted by the diode chip.

As in the structural embodiments, the step of forming the raised border can be selected from among the steps of depositing a metal, a ceramic, or another semiconductor.

In some cases, the step of forming the raised border can comprise etching a silicon carbide substrate.

In the context of white light emitting diodes, the method comprises forming the raised border on a blue light emitting diode chip and filling the well with the polymer resin that carries a dispersed phosphor that emits predominantly in the yellow frequencies. If desired, the blue output of the chip can be measured at this point, following which the resin and phosphor are added in a combination that will produce a desired color coordinate of white light based upon the measured frequency output of the diode chip and the output of the phosphor.

Figure 9:
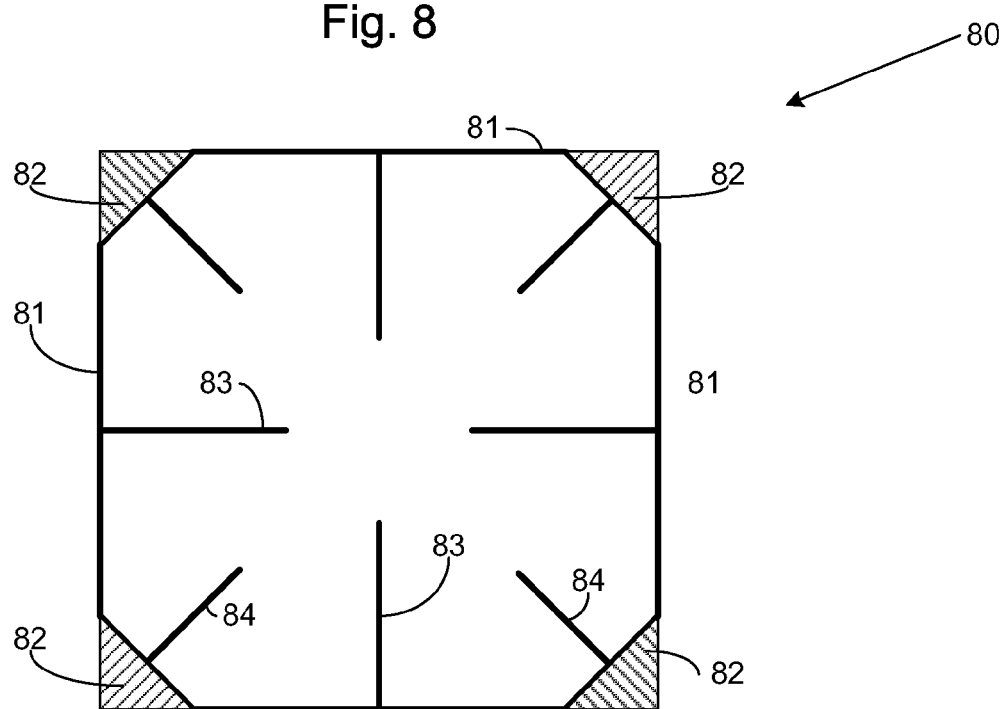
FIG. 9 is a top plan view of one embodiment of the diode structure according to the present invention.

FIG. 9 is a top plan view of another embodiment of a diode broadly designated at 80 according to the present invention. In this embodiment the raised border is formed of metal and is designated at 81. Wire bond pads for the diode form the corners 82. A number of current spreading fingers 83 and 84 are included within the well formed by the border 81 and the surface 85 of the active portion. This embodiment illustrates how the border can redirect low angle light to obtain greater quantum efficiency as well as illustrating a universal orientation for attaching the chip (because each side is identical).

This also provides the ability to string multiple chips together in series or parallel, because in this embodiment, the raised border 81 can actually form part of the current spreading fingers.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
   a support structure;
   an epitaxial active portion on said support structure;
   a raised border on a top surface of said active portion, opposite said support structure, wherein said raised border defines a first space on said top surface of said active portion, said first space receives a resin, and said raised border defines a second space, wherein said second space is between an edge of said active portion and said raised border;
   said resin laterally confined within said first space defined by said raised border and said top surface of said active portion;
   phosphor particles in said resin that convert the frequencies emitted by said active portion, wherein said raised border is arranged such that said phosphor particles occupy a portion of said resin near said raised border; and
   an ohmic contact to said top surface of said active portion, wherein said ohmic contact is outside said raised border.

2. A light emitting diode according to claim 1 wherein said active portion is formed from the Group III nitride material system.

3. A light emitting diode according to claim 2 wherein said active portion comprises indium gallium nitride.

4. A light emitting diode according to claim 2 wherein said active portion is on a supporting structure selected from the group consisting of silicon carbide, sapphire, and sub-mounting structures.

5. A light emitting diode according to claim 1 wherein said raised border is selected from the group consisting of metals, semiconductors, and ceramics.

6. A light emitting diode according to claim 1 wherein said resin is a polysiloxane resin and said phosphor is yttrium aluminum garnet.

7. A light emitting diode according to claim 1 comprising an active portion that emits in the blue portion of the spectrum and a phosphor that down-converts the blue emission from the diode into predominantly yellow frequencies.

8. A light emitting diode according to claim 1 wherein said resin is selected from the group consisting of PMMA, polycarbonate, polysiloxane, and polyester.

9. A light emitting diode according to claim 1, wherein said raised border is substantially around the perimeter of the top surface of said active portion.

10. A light emitting diode comprising:
    a support structure;
    an epitaxial active portion on said support structure;
    a raised border on a top surface of said active portion, opposite said support structure, and around a perimeter of the top surface of said active portion, wherein said raised border defines a first space receives a resin and said raised border defines a second space between an edge of said active portion and said raised border;
    said resin in the first space defined by said raised border and said top surface of said active portion;
    phosphor particles in said resin that convert the frequencies emitted by said active portion, wherein said raised border is arranged such that said phosphor particles occupy the portion of said resin near said raised border; and
    an ohmic contact to said top surface of said active portion, wherein said ohmic contact is outside said raised border.

11. A semiconductor precursor wafer comprising:
    a support structure;
    a plurality of LED precursors on said support structure;
    a plurality of said LED precursors comprising a raised border on the perimeter of an LED precursor surface opposite said support structure, wherein said raised border defines a first space on said LED precursor surface, said first space receives a polymer resin and said raised border defining a second space, wherein said second space is between an edge of said LED precursor surface and said raised border;
    a plurality of said bordered LED precursors comprising said polymer resin, wherein said polymer resin is laterally confined within the first space defined by said raised border and the LED precursor surface;
    a plurality of said resin-filled LED precursors comprising phosphor particles in said resin, wherein said raised border is arranged such that said phosphor particles occupy the portion of said resin near said raised border.

12. A semiconductor precursor wafer according to claim 11 wherein said substrate is selected from the group consisting of silicon carbide, sapphire, and sub-mounting structures.

13. A semiconductor precursor wafer according to claim 11 wherein said LEDs are formed from the Group III nitride material system.

14. A semiconductor precursor wafer according to claim 11 wherein each of said LED precursors includes an identical composition and amount of phosphor in said resin.

15. A semiconductor precursor wafer according to claim 11 wherein different LED precursors include different amounts of phosphor in said resin.

16. A semiconductor precursor wafer according to claim 11 wherein different LED precursors include different phosphor compositions in said resin.

17. A semiconductor precursor wafer according to claim 11 wherein different LED precursors include different resin compositions.

18. A semiconductor precursor wafer according to claim 11 wherein said resin is selected from the group consisting of PMMA, polycarbonate, polysiloxane, and polyester.

19. A semiconductor precursor wafer according to claim 11 wherein said perimeter borders are selected from the group consisting of metals, semiconductors, and ceramics.

20. A semiconductor precursor wafer according to claim 11 wherein said LED precursors emit in the blue portion of the spectrum and said phosphor is a phosphor that down-converts the blue emission from the LED precursors into predominantly yellow frequencies.

21. A semiconductor precursor wafer according to claim 11, a plurality of said LED precursors comprising an ohmic contact to said top surface of said active portion, wherein said ohmic contact is outside said raised border.

* * * * *